(12) United States Patent
Cheah et al.

(10) Patent No.: US 11,195,801 B2
(45) Date of Patent: Dec. 7, 2021

(54) EMBEDDED REFERENCE LAYERS FOR SEMICONDUCTOR PACKAGE SUBSTRATES

(71) Applicant: Intel Corporation, Santa Clara, CA (US)

(72) Inventors: Bok Eng Cheah, Bukit Gambir (MY); Seok Ling Lim, Kulim (MY); Jenny Shio Yin Ong, Bayan Lepas (MY); Jackson Chung Peng Kong, Tanjung Tokong (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/663,853

(22) Filed: Oct. 25, 2019

(65) Prior Publication Data

US 2020/0168559 A1 May 28, 2020

(30) Foreign Application Priority Data

Nov. 28, 2018 (MY) .......................... PI 2018002208

(51) Int. Cl.
*H01L 23/552* (2006.01)
*H01L 23/48* (2006.01)
*H01L 23/522* (2006.01)
*H01L 23/528* (2006.01)

(52) U.S. Cl.
CPC .......... *H01L 23/552* (2013.01); *H01L 23/481* (2013.01); *H01L 23/5226* (2013.01); *H01L 23/5283* (2013.01); *H01L 23/5286* (2013.01)

(58) Field of Classification Search
CPC . H01L 23/552; H01L 23/481; H01L 23/5226; H01L 23/5283; H01L 23/5286; H05K 3/426; H05K 1/0313; H05K 1/115; H05K 1/111; H05K 3/0094
See application file for complete search history.

(56) References Cited

U.S. PATENT DOCUMENTS

| | | | | |
|---|---|---|---|---|
| 6,072,690 | A * | 6/2000 | Farooq | H01G 4/30 |
| | | | | 257/E23.067 |
| 10,842,021 | B1 * | 11/2020 | Song | H01L 23/645 |
| 2006/0226534 | A1 * | 10/2006 | Liang | H01L 23/3128 |
| | | | | 257/698 |
| 2008/0261005 | A1 * | 10/2008 | Nomiya | H01L 23/15 |
| | | | | 428/210 |
| 2012/0326334 | A1 * | 12/2012 | Sakaguchi | H01L 21/6835 |
| | | | | 257/778 |
| 2014/0027165 | A1 * | 1/2014 | Morita | H05K 1/024 |
| | | | | 174/258 |
| 2014/0353027 | A1 * | 12/2014 | Osaki | H05K 1/0251 |
| | | | | 174/264 |
| 2015/0062851 | A1 * | 3/2015 | Shimizu | H05K 3/421 |
| | | | | 361/767 |
| 2015/0257282 | A1 * | 9/2015 | We | H05K 1/0306 |
| | | | | 361/767 |
| 2015/0327363 | A1 * | 11/2015 | Inagaki | H05K 1/181 |
| | | | | 174/251 |

(Continued)

*Primary Examiner* — Nathan W Ha
(74) *Attorney, Agent, or Firm* — Schwegman Lundberg & Woessner, P.A.

(57) ABSTRACT

Two conductive reference layers are embedded in a semiconductor package substrate. The embedded reference layers facilitate low electromagnetic noise coupling between adjacent signals for semiconductor device package.

19 Claims, 8 Drawing Sheets

(56) References Cited

U.S. PATENT DOCUMENTS

| | | | | |
|---|---|---|---|---|
| 2016/0037629 A1* | 2/2016 | Takahashi | ............... | H05K 3/16 |
| | | | | 174/257 |
| 2016/0043068 A1* | 2/2016 | Ramachandran | ... | H01L 27/0288 |
| | | | | 257/532 |
| 2016/0150642 A1* | 5/2016 | Kajita | .................. | H05K 1/0298 |
| | | | | 361/783 |
| 2016/0242283 A1* | 8/2016 | Hayashi | ............... | H05K 3/4673 |
| 2016/0353569 A1* | 12/2016 | Furuichi | ............. | H05K 3/4623 |
| 2018/0168043 A1* | 6/2018 | Cheah | ................. | H01L 21/4857 |
| 2018/0350616 A1* | 12/2018 | Huang | .................... | H01L 24/20 |
| 2019/0098752 A1* | 3/2019 | Sakamoto | ............ | H05K 3/4644 |
| 2019/0132962 A1* | 5/2019 | Harazono | ........... | H05K 1/0373 |
| 2019/0373740 A1* | 12/2019 | Taniguchi | ........... | H05K 3/0094 |
| 2019/0380203 A1* | 12/2019 | Ota | ........................ | H05K 3/422 |
| 2019/0380210 A1* | 12/2019 | Lin | ........................ | H01L 24/17 |
| 2021/0076508 A1* | 3/2021 | Lin | ....................... | H05K 1/181 |

\* cited by examiner

EMBEDDED REFERENCE LAYERS FOR SEMICONDUCTOR PACKAGE SUBSTRATES

PRIORITY APPLICATION

This application claims the benefit of priority to Malaysian Application Serial Number PI 2018002208, filed Nov. 28, 2018, which is incorporated herein by reference in its entirety.

FIELD

This disclosure relates to reference-layer placement for semiconductor package substrates.

BACKGROUND

Semiconductive device miniaturization during packaging includes challenges to mitigate electromagnetic noise coupling between adjacent signals as well as current return path issues.

BRIEF DESCRIPTION OF THE DRAWINGS

Disclosed embodiments are illustrated by way of example, and not by way of limitation, in the figures of the accompanying drawings where like reference numerals may refer to similar elements, in which.

DETAILED DESCRIPTION

Package form-factor miniaturization is facilitated by locating at least two reference planes in the semiconductor package substrate. Package footprint requirements is minimized by facilitating trace widths and impedance requirements with the reference layers. By locating a reference layer close to a given trace, reduced electromagnetic noise coupling and power-delivery inductance loop are achieved.

In an embodiment, a reference layer is also a package core. A package core refers to a supporting structure within a semiconductor device package, which is mounted on a board such as a printed wiring board. In an embodiment, a package-core reference layer, plus at least one additional reference layer, is sufficient for the semiconductor package substrate to be a direct-chip-attach board.

In an embodiment, the signal-to-ground ratio achieved by disclosed examples, is 1:1, and plated through-hole (PTH) count is reduced, while preserving useful electromagnetic shield and current return path. In an embodiment, improved crosstalk coupling isolation between adjacent signals is achieved by the disclosed examples.

Figure 1A:
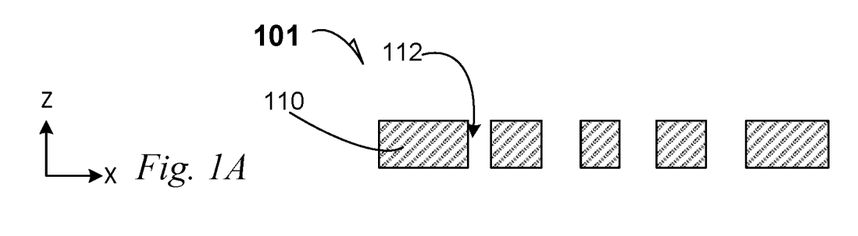
FIG. 1A is a cross-section elevation of a semiconductor package substrate during assembly according to an embodiment.

FIG. 1A is a cross-section elevation of a semiconductor package substrate 101 during assembly according to an embodiment. A metallic reference layer 110 such as a copper-containing material, has been patterned with several through-holes, one of which is indicated by reference number 112. The several through-holes 112 represent communication corridors through a central or core layer of a semiconductor package substrate (see, e.g. FIG. 2). In an embodiment, the several through-holes 112 are formed by a mechanical drilling technique. In an embodiment, the several through-holes 112 are formed by a stamping technique. In an embodiment, the several through-holes 112 are formed by a patterned electroplating technique on a temporary carrier.

Processing on the first reference layer 110 is carried out both above and below on the X-Y surface, where the Y-direction is orthogonal to the drawing. In an embodiment, mirror-image processing is done on more than one reference layer. In an embodiment, processing for different reference layers, above and below differ as the upper layers are configured to closely couple with, e.g. a semiconductive device, and the lower layers are configured to closely couple with, e.g. a board such as a printed wiring board.

Figure 1B:
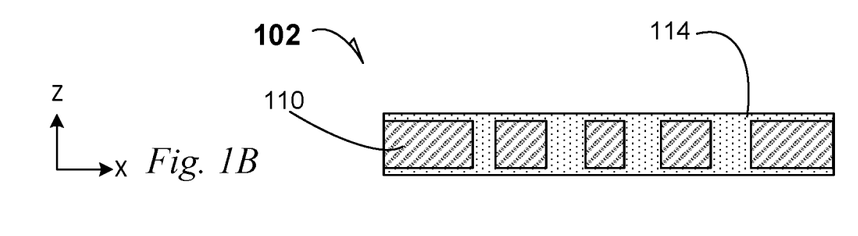
FIG. 1B is a cross-section elevation of the semiconductor package substrate depicted in FIG. 1A after further assembly according to an embodiment.

FIG. 1B is a cross-section elevation of the semiconductor package substrate depicted in FIG. 1A after further assembly according to an embodiment. The semiconductor package substrate 102 has been processed by covering the conductive core 110 with a dielectric layer 114. In an embodiment, the dielectric layer 114 fills all the several through-holes 112 (see FIG. 1A), and processing is accomplished by spinning on and curing dielectric material 114. In an embodiment, the dielectric layer 114 is formed by sputtering from a dielectric target under conditions that fill the several through-holes 112, and that covers the X-Y surfaces of the conductive core 110. In an embodiment, the dielectric layer 114 is formed by seating the conductive core 110 on a green dielectric film, followed by dispensing and spreading additional dielectric material 114 under conditions that fill the several through-holes 112, and that covers the upper X-Y surfaces of the conductive core 110.

Figure 1C:
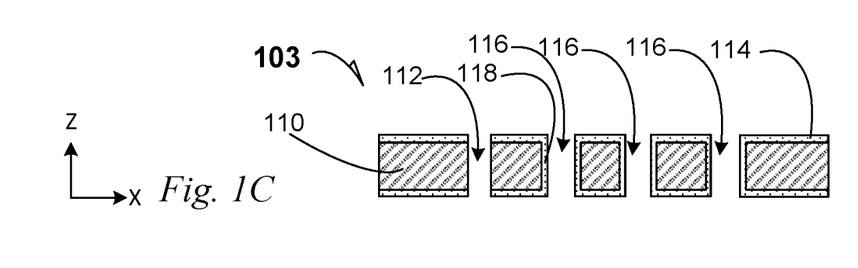
FIG. 1C is a cross-section elevation of the semiconductor package substrate depicted in FIG. 1B after further assembly according to an embodiment.

FIG. 1C is a cross-section elevation of the semiconductor package substrate depicted in FIG. 1B after further assembly according to an embodiment. The semiconductor package substrate 103 has been processed by opening two types of through-holes, including a reference-layer through-hole 112 and insulated through-holes 116. The reference-layer through-hole 112 has been drilled to expose the conductive core 110. The insulated through holes 116 have been drilled to leave a contact-corridor insulation film 118 on interior sidewalls of the conductive core 110. The contact-corridor insulation film 118 is part of the dielectric material 114 in an embodiment.

Figure 1D:
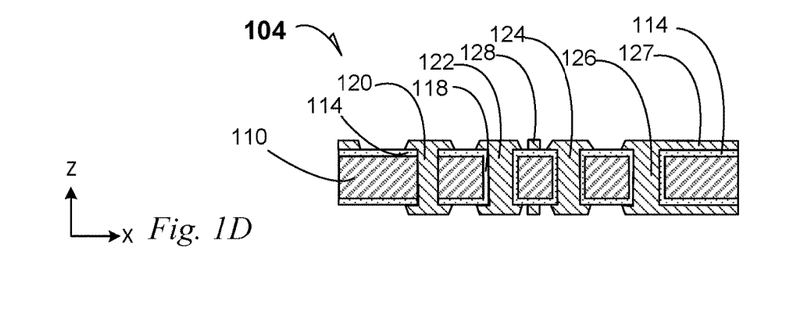
FIG. 1D is a cross-section elevation of the semiconductor package substrate depicted in FIG. 1C after further assembly according to an embodiment.

FIG. 1D is a cross-section elevation of the semiconductor package substrate depicted in FIG. 1C after further assembly according to an embodiment. The semiconductor package substrate 104 has been processed by plating the several through-holes, followed by patterning on opposing X-Y surfaces. In an embodiment, a ground or reference via 120 has been formed by electroplating that uses the conductive core 110 as a cathode, such that contact is made between the reference via 120 and the conductive core 110. A portion of the ground via 120 overlaps onto the dielectric material 114 to form a landing pad or a bond pad, depending upon a given application. The several vias 120, 122, 124 and 126 may be referred to a plated through holes (PTHs), but in any event they are plated in the several respective contact corridors.

In an embodiment, a first signal via 122 has been formed by electroplating such as electroless and electrolytic plating, but plates against the contact-corridor insulation film 118, followed by patterning to remove shorts from the ground via 120. The first signal via 122 is insulated and carried within a signal contact corridor, by the insulation film 118. Similarly, in an embodiment, a subsequent signal via 124 has been formed by electroplating such as electroless and electrolytic plating, followed by patterning to remove shorts from the ground via 120. The subsequent signal via 124 is insulated and carried in the signal contact corridor from the reference layer 110 by the contact-corridor insulation film 118.

In an embodiment, a power via 126 has been formed by electroplating such as electroless and electrolytic plating, followed by patterning to remove shorts from the power via 126. The power signal via 126 is insulated and carried within the power contact corridor by the contact-corridor insulation film 118. In an embodiment, a trace portion 127 of the power via 126 has been formed above the reference layer 110, and the trace portion 127 is separated from the reference layer 110 by the dielectric material 114.

In an embodiment, an orthogonal trace 128 (which runs orthogonally, into and out of the plane of the drawing) is also formed by electroplating such as electroless and electrolytic plating, followed by patterning. The orthogonal trace 128 is also separated from the reference layer 110 by the dielectric material 114.

Figure 1E:
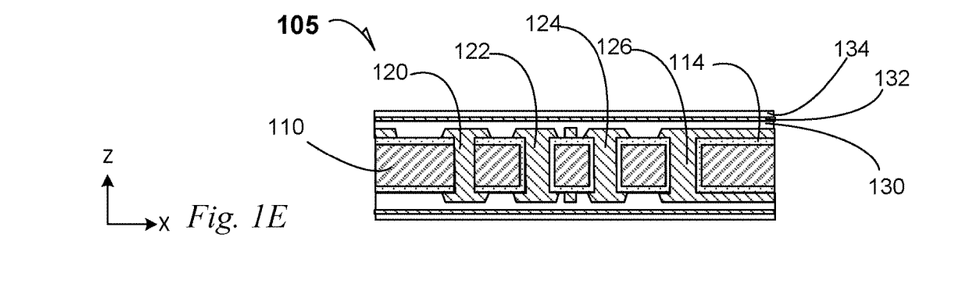
FIG. 1E is a cross-section elevation of the semiconductor package substrate depicted in FIG. 1D after further assembly according to an embodiment.

FIG. 1E is a cross-section elevation of the semiconductor package substrate depicted in FIG. 1D after further assembly according to an embodiment. The semiconductor package substrate 105 has been processed by covering the several vias and traces with a dielectric film 130, followed by a conductive layer 132, and thereon followed by another dielectric film 134. The structure achieved by these items 130, 132 and 134, achieves an insulated conductive layer 132. In an embodiment, processing includes lamination techniques such as hot-pressing the dielectric film 134 and the conductive layer 132, onto the dielectric layer 130.

In an embodiment, the conductive layer 132 has a thickness in a range from 3 micrometer (μm) to 30 μm. In an embodiment, the conductive layer 132, as well as any disclosed conductive layer is in this thickness range and the core reference layer 110 has the greatest thickness. For example, where the reference layer 132 has the 3 to 30 μm Z-thickness range, the core reference layer 110 has a thickness in a range from 50 μm to 500 μm. Other thickness ratios between a core reference layer, e.g., layer 110, and another reference layer, e.g., layer 132, apply to all disclosed examples, and are set forth with respect to disclosed embodiments depicted and described in FIG. 2.

Figure 1F:
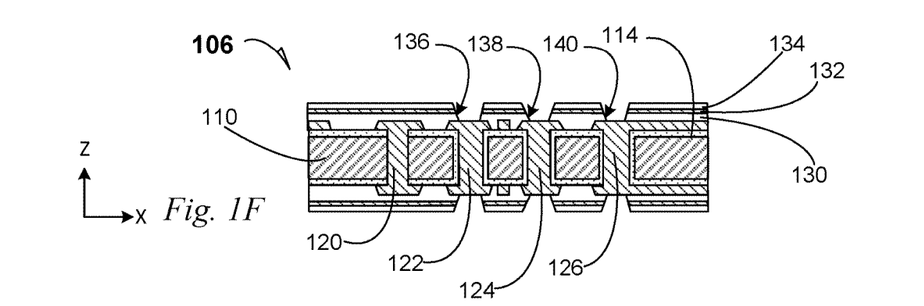
FIG. 1F is a cross-section elevation of the semiconductor package substrate depicted in FIG. 1E after further assembly according to an embodiment.

FIG. 1F is a cross-section elevation of the semiconductor package substrate depicted in FIG. 1E after further assembly according to an embodiment. The semiconductor package substrate 106 has been processed by opening signal contact corridors 136 and 138, and a power contact corridor 140 through the structures 130, 132 and 134, to expose the respective signal vias 122 and 124 and the power via 126.

Figure 1G:
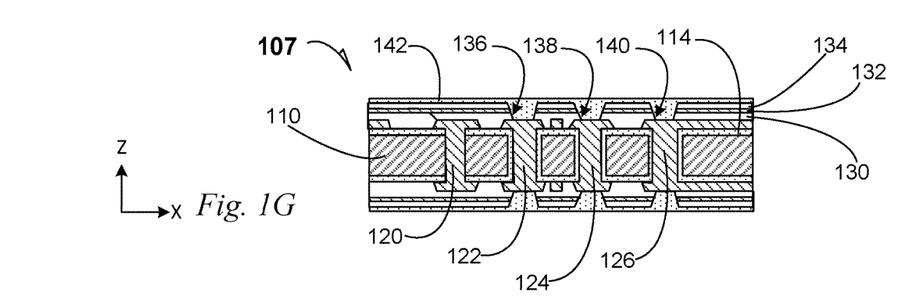
FIG. 1G is a cross-section elevation of the semiconductor package substrate depicted in FIG. 1F after further assembly according to an embodiment.

FIG. 1G is a cross-section elevation of the semiconductor package substrate depicted in FIG. 1F after further assembly according to an embodiment. The semiconductor package substrate 107 has been processed by forming a third dielectric layer 142 to fill the signal contact corridors 136 and 138, and the power contact corridor 140.

Figure 1H:
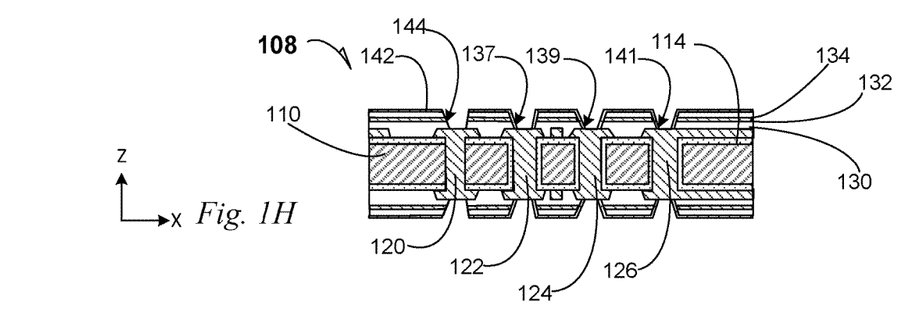
FIG. 1H is a cross-section elevation of the semiconductor package substrate depicted in FIG. 1G after further assembly according to an embodiment.

FIG. 1H is a cross-section elevation of the semiconductor package substrate depicted in FIG. 1G after further assembly according to an embodiment. The semiconductor package substrate 108 has been processed by opening insulated signal contact corridors 137 and 139 from the signal contact corridors 136 and 138 (see FIG. 1G), and by opening an insulated power contact corridor 141 from the power contact corridor 140. Processing has also opened a ground contact corridor 144 through the structure 130, 132 and 134, to expose the ground via 120.

Figure 1K:
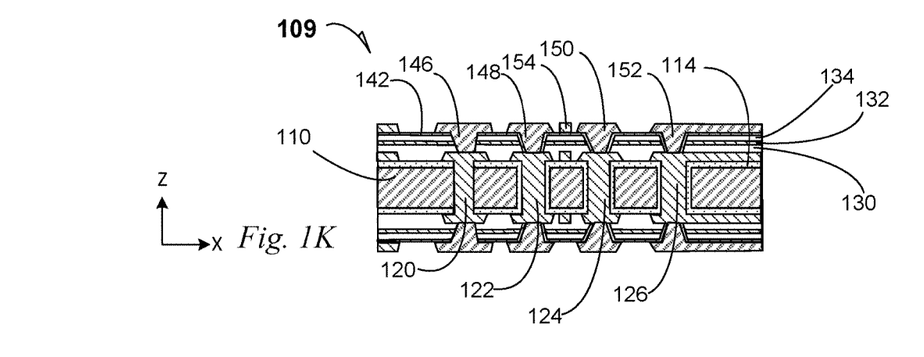
FIG. 1K is a cross-section elevation of the semiconductor package substrate depicted in FIG. 1H after further assembly according to an embodiment.

FIG. 1K is a cross-section elevation of the semiconductor package substrate depicted in FIG. 1H after further assembly according to an embodiment. Items 1I and 1J are omitted. The semiconductor package substrate 109 has been processed by plating and patterning to achieve vias and traces. For example, a second-level ground via 146 contacts the ground via 120 at a landing-pad portion, a second-level signal via 148 contacts the signal via 122, a second-level signal via 150 contacts the signal via 124, and a second-level power via 152 contacts the power via 126. In an embodiment, a second-level trace 154 is between the structures 148 and 150, and it is depicted running orthogonal to the plane of the drawing.

Figure 2:
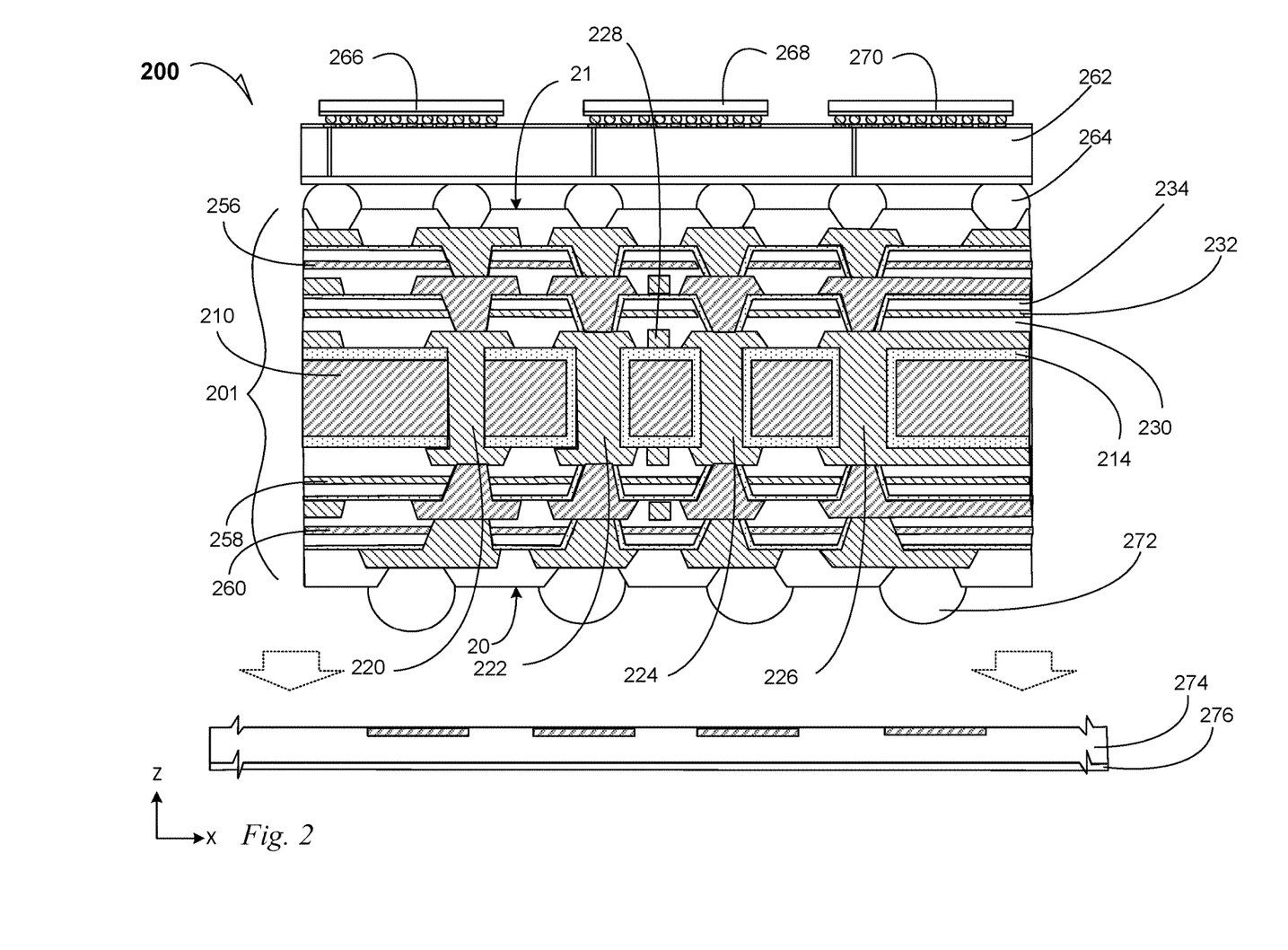
FIG. 2 is a cross-section elevation of a semiconductor device package according to an embodiment.

FIG. 2 is a cross-section elevation of a semiconductor device package 200 according to an embodiment. Several processes and assembly techniques depicted in FIGS. 1A through 1K are used to achieve a semiconductor package substrate 201. A semiconductor package substrate 201 includes a die side 21 and a land side 20, and a core reference layer 210 embedded between the die side 21 and the land side 20. The core reference layer 210 acts to ground electronic devices, as well as to provide warpage resistance and structural stability.

In an embodiment, the first reference layer 210 acts as a package core 210 and it is centrally located as illustrated in FIG. 2. In an embodiment, the first reference layer 210 is centrally located within the semiconductor package substrate 210 and it has a greater Z-thickness than the subsequent reference layer 232.

In an embodiment, a first reference via 220, a first and a subsequent signal via 222 and 224, and a first power via 226 have been formed by electroplating such as electroless and electrolytic plating process. The power and signal vias are insulated by dielectric material 214. In an embodiment, the conductive core 210 serves as a cathode for the electroplating process.

In an embodiment, an orthogonal trace 228 (which runs orthogonally, into and out of the plane of the drawing) is also formed by electroplating such as electroless and electrolytic plating, followed by patterning. The orthogonal trace 228 is also separated from the reference layer 210 by the dielectric material 214.

In an embodiment, a subsequent reference layer 232, when referring to the conductive core 210 as a first reference layer 210, is also embedded between the die side 21 and the land side 20. As illustrated, the subsequent reference layer 232 is between the core and the die side 21. In an embodiment, a third reference layer 258, when referring to the conductive core 210 as a first reference layer 210, is also embedded between the conductive core and the land side 20. As illustrated, the subsequent reference layer 232 and the third reference layer 258 are symmetrically spaced on opposite sides of the first reference layer 210. In an embodiment, four conductive layers 232 and 256 above the conductive core 210, and 258 and 260 below the conductive core 210, are prepared and laminated into the semiconductor package substrate 201. In an embodiment, only the conductive core 210 and the subsequent reference layer 232 are assembled into the semiconductor package substrate 201. In an embodiment, the conductive core 210 and only the reference layers 232 and 258 are assembled into the semiconductor package substrate 201. In an embodiment, the subsequent 232 and third 258 reference layers are symmetrically located with the core reference layer 210 between the subsequent reference layer 232 and the third reference layer 258.

In an embodiment, the conductive core 210 and only the reference layers 232 and 256 are assembled into the semiconductor package substrate 201, such that no reference layers are below the conductive core 210. In an embodiment, the conductive core 210, the reference layers 232 and 256, and only one of the reference layers 258 and 260 are assembled into the semiconductor package substrate 201.

In an embodiment, the conductive core 210, and the four reference layers 232, 256, 258 and 260 are all present. In an embodiment, the conductive core 210, and the four reference layers 232, 256, 258 and 260 are all present, and the conductive core has a vertical (Z-direction) thickness ratio to the other reference layers, in a range from 1:1 to 20:1. In an embodiment, the thickness ratio of the structure 210 to any of the structures 232, 256, 258 and 260, is in a range from 2:1 to 3:1. In an embodiment, the thickness ratio of the structure 210 to any of the structures 232, 256, 258 and 260, is in a range from 2:1 to 15:1. In an embodiment, the thickness ratio of the structure 210 to any of the structures 232, 256, 258 and 260, is in a range from 2:1 to 4:1.

In an embodiment, only the reference layers 232 and 256 are assembled into the semiconductor package substrate 201 without the conductive core 210 e.g., in a coreless package embodiment.

In an embodiment, a semiconductive device 262 is flip-chip seated on the semiconductor package substrate 201 by an electrical bump array, one bump of which is indicated by reference number 264.

In an embodiment, a chip stack includes the semiconductive device 262 and at least one through-silicon via connected device 266, 268 and 270. In an embodiment, the semiconductive device 266 is a memory die 266 and the semiconductive device 262 is a core processor. In an embodiment, the semiconductive device 268 is a core processor 268 and the semiconductive device 262 is a platform controller hub. In an embodiment, the semiconductive device 268 is a core processor 268 and the semiconductive device 262 is part of a chipset. In an embodiment, the semiconductive device 270 is a baseband processor 270 and the semiconductive device 262 is a core processor.

By locating at least two reference planes within the semiconductor package substrate 210, signal integrity is enhanced where current-return paths are shortened into the relative low resistivity of a given reference plane. In an embodiment, power integrity is enhanced where inductance loops are reduced with the close proximity between a ground (Vss) reference plane and a power (Vcc) plane.

In an embodiment, a landside bump array 272 is prepared for mounting upon a board 274 such as a motherboard-type printed wiring board 274. In an embodiment, the board 274 has an integral external shell 276 that is useful as the commercially sold outer casing of a computing device such as a hand-held device. In an embodiment, the external shell provides at least one of physical and dielectric protection for the semiconductor package substrate 201.

Figure 3:
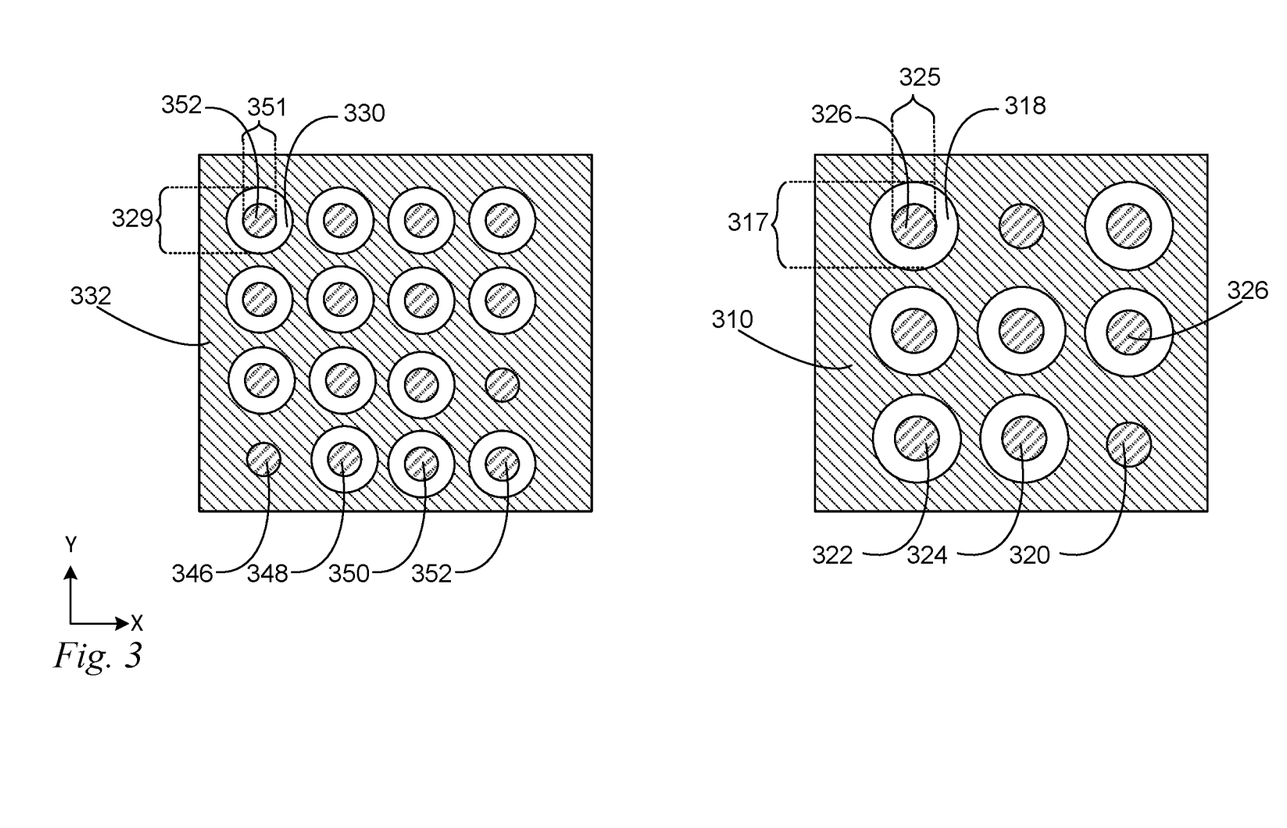
FIG. 3 depicts two plan views of reference layers according to several embodiments.

FIG. 3 depicts two plan views of reference layers according to several embodiments. With the presence of at least two reference planes, e.g. the core reference plane 210 and the reference plane 232, improved routing density is achievable in square-pitch PTH configurations as illustrated. In an embodiment, with the presence of at least two reference planes, improved routing density is achievable in face-centered cubic PTH configurations. In an embodiment, with the presence of at least two reference planes, improved routing density is achievable in hexagonal face-centered PTH configurations.

A core reference layer 310 includes a contact-corridor insulation 318 that surrounds vias including signal vias 322 and power vias 324. A reference via 320 makes direct contact with the reference layer 310. In an embodiment, the contact-corridor insulation 318 has a diameter 317 that accommodates, e.g., a power via 326, which has a diameter 325. In an embodiment, the ratio of the insulation diameter 317 to the power via diameter 325 is in a range from 1.1 to 2, and the pitch between any two insulated vias, measured by the nominal diameter of a given via, is in a range from 1.9 to 3.

An intermediate reference layer 332, such as the reference layers 132 and 232, depicted in respective FIGS. 1K and 2, includes the contact-corridor insulation 330 that surrounds vias including signal vias 348 and 350 and power vias 352. A reference via 346 makes direct contact with the reference layer 332. In an embodiment, the contact-corridor insulation 330 has a diameter 329 that accommodates, e.g., a power via 352, which has a diameter 351. In an embodiment, the ratio of the insulation diameter 329 to the power via diameter 351 is in a range from 1.1 to 2, and the pitch between any two insulated vias, measured by a given via diameter, is in a range from 1.9 to 3. In an embodiment, the two contact-corridor pitches are different.

As depicted, via pitch within the core reference layer 310 that contains PTH contacts, is larger than the denser via pitch within the given reference layer 332 according to an embodiment.

Figure 4:
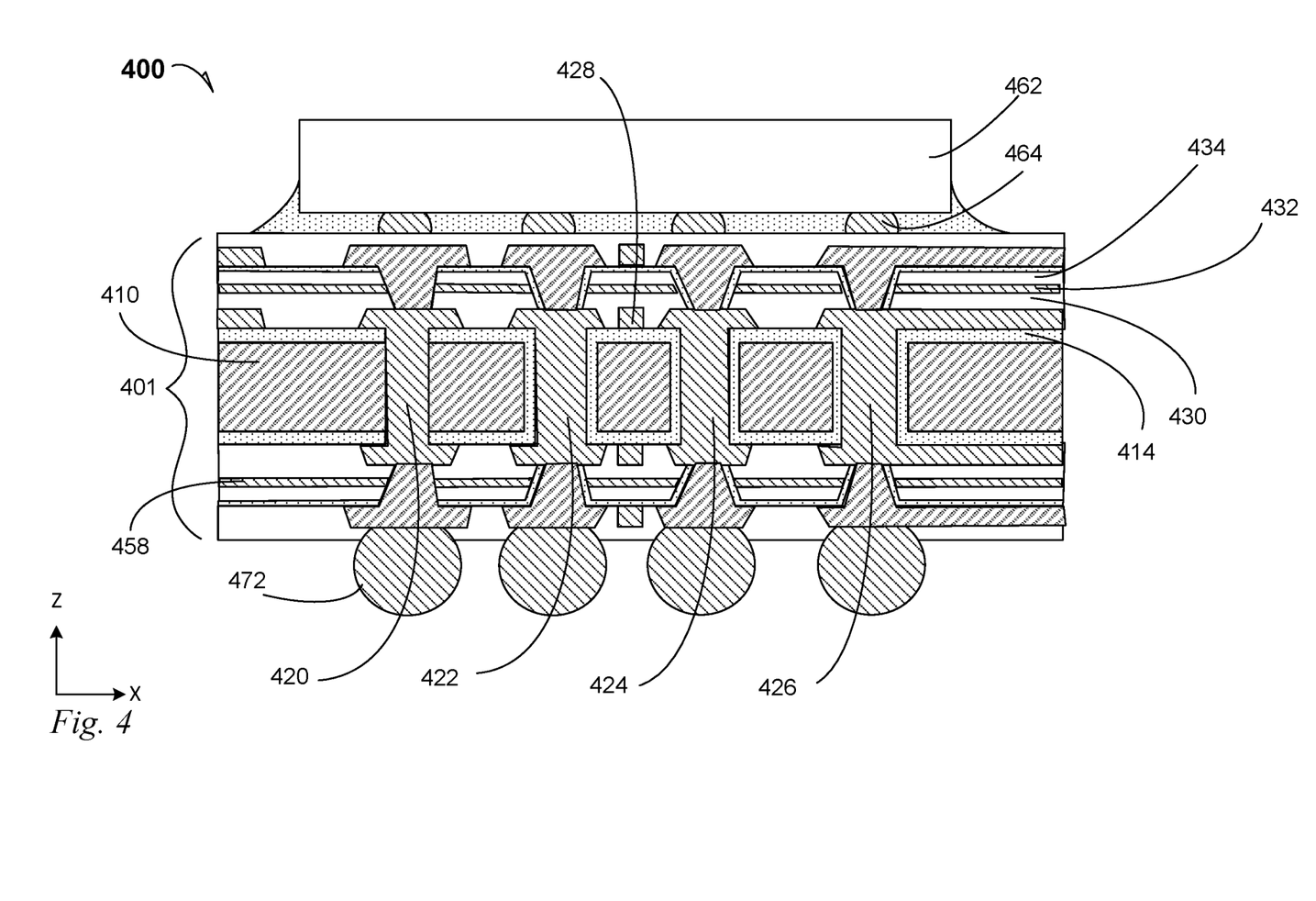
FIG. 4 is a cross-section elevation of a semiconductor device package according to an embodiment.

FIG. 4 is a cross-section elevation of a semiconductor device package 400 according to an embodiment. Several processes and assembly techniques depicted in FIGS. 1A through 1K are used to achieve a semiconductor package substrate 401. A semiconductor package substrate 401 includes a core reference layer 410, that acts to ground electronic devices.

In an embodiment, an orthogonal trace 428 (which runs orthogonally, into and out of the plane of the drawing) is also formed by electroplating such as electroless and electrolytic plating, followed by patterning. The orthogonal trace 428 is also separated from the reference layer 410 by the dielectric material 414.

In an embodiment, a first reference via 420, a first and a subsequent signal via 422 and 424, and a first power via 426 have been formed by electroplating such as electroless and electrolytic plating. The power and signal vias are insulated by dielectric material 414.

In an embodiment, a conductive layer 432 above the conductive core 410, and a conductive layer 458 below the conductive core 410, are prepared and laminated into the semiconductor package substrate 401. In an embodiment, only the conductive core 410 and the first reference layer 432 are assembled into the semiconductor package substrate 401. In an embodiment, the conductive core 410 and the reference layers 432 and 458 are assembled into the semiconductor package substrate 401. In an embodiment, the conductive core 410 and only the reference layer 432 are assembled into the semiconductor package substrate 401, such that no reference layers are below the conductive core 410. In an embodiment, the conductive core 410, and only the reference layer 458 are assembled into the semiconductor package substrate 401.

In an embodiment, the conductive core 410, and the two reference layers 432 and 458 are all present. In an embodiment, the conductive core 410, and the two reference layers 432 and 458 are all present, and the conductive core 410 has a thickness ratio to the other reference layers, in a range from 1:1 to 20:1. In an embodiment, the thickness ratio of the structure 410 to any of the structures 432 and 458, is in a range from 2:1 to 3:1. In an embodiment, the thickness ratio of the structure 410 to any of the structures 432 and 458, is in a range from 2:1 to 15:1. In an embodiment, the thickness ratio of the structure 410 to any of the structures 432 and 458, is in a range from 2:1 to 4:1.

In an embodiment, a semiconductive device 462 is flip-chip seated on the semiconductor package substrate 401 by an electrical bump array, one bump of which is indicated by reference number 464.

In an embodiment, the semiconductive device 462 is a core processor. In an embodiment, the semiconductive device 462 is a memory die. In an embodiment, the semiconductive device 462 is a platform controller hub or a chipset. In an embodiment, the semiconductive device 462 is a baseband processor.

In an embodiment, a landside bump array 472 is prepared for mounting upon a board such as a motherboard-type printed wiring board. For example, where fewer layers are required to build the semiconductor device package 400, but it is useful to assemble it with the semiconductor device package 200 on the same board 274, the two semiconductor device packages 200 and 400 are assembled onto the board 274. In an embodiment, the two semiconductor device packages 200 and 400 are assembled side-by-side on the board 274. In an embodiment, the two semiconductor device packages 200 and 400 are on the board, and at least one of the devices 266, 268 and 270 are TSV coupled to the semiconductive device 262.

Figure 5:
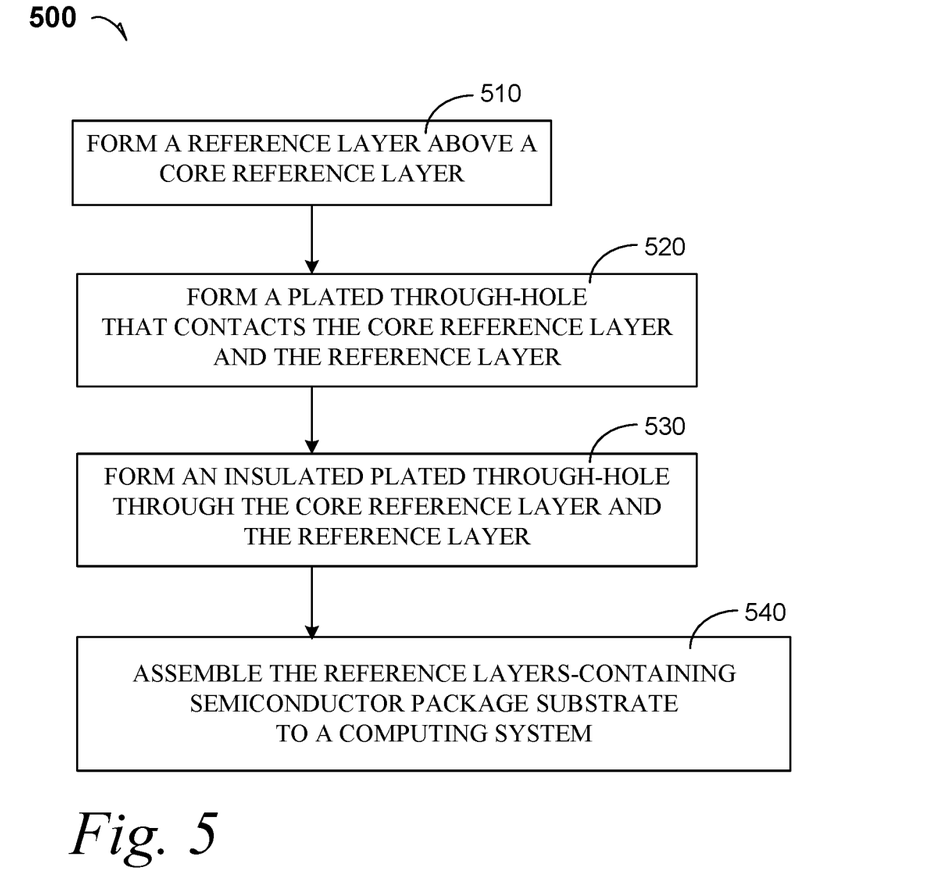
FIG. 5 is a process flow diagram according to several embodiments.

FIG. 5 is a process flow diagram according to several embodiments.

At 510, the process includes forming a subsequent reference layer above a core reference layer. For example, the reference layer 132 is formed above the core reference layer 110.

At 520, the process includes forming a plated through hole that contacts the core reference layer and the reference layer.

At 530, the process includes forming a plated through hole that is insulated from the core reference layer and from the reference layer.

At 540, the process includes assembling the reference layers-containing semiconductor package substrate to a computing system.

Figure 6:
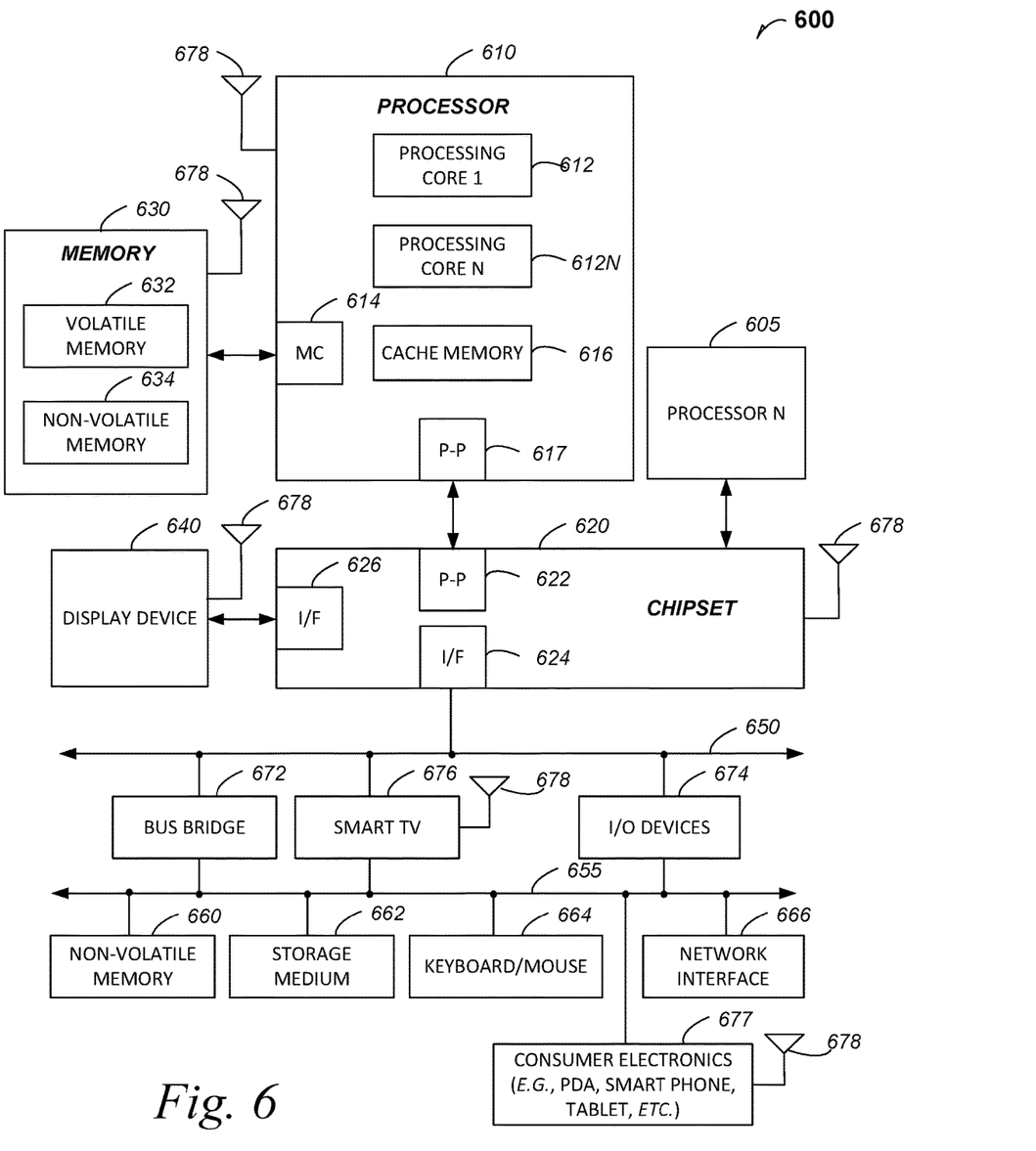
FIG. 6 is included to show an example of a higher-level device application for the disclosed embodiments

FIG. 6 is included to show an example of a higher-level device application for the disclosed embodiments. The multiple reference-layers package substrate containing embodiments may be found in several parts of a computing system. In an embodiment, the multiple reference-layers package substrate embodiments can be part of a communications apparatus such as is affixed to a cellular communications tower. In an embodiment, a computing system 600 includes, but is not limited to, a desktop computer. In an embodiment, a system 600 includes, but is not limited to a laptop computer. In an embodiment, a system 600 includes, but is not limited to a tablet. In an embodiment, a system 600 includes, but is not limited to a notebook computer. In an embodiment, a system 600 includes, but is not limited to a personal digital assistant (PDA). In an embodiment, a system 600 includes, but is not limited to a server. In an embodiment, a system 600 includes, but is not limited to a workstation. In an embodiment, a system 600 includes, but is not limited to a cellular telephone. In an embodiment, a system 600 includes, but is not limited to a mobile computing device. In an embodiment, a system 600 includes, but is not limited to a smart phone. In an embodiment, a system 600 includes, but is not limited to an internet appliance. Other types of computing devices may be configured with the microelectronic device that includes multiple reference-layers package substrate embodiments.

In an embodiment, the processor 610 has one or more processing cores 612 and 612N, where 612N represents the Nth processor core inside processor 610 where N is a positive integer. In an embodiment, the electronic device system 600 using a EMIB-backside trace containing embodiment that includes multiple processors including 610 and 605, where the processor 605 has logic similar or identical to the logic of the processor 610. In an embodiment, the processing core 612 includes, but is not limited to, pre-fetch logic to fetch instructions, decode logic to decode the instructions, execution logic to execute instructions and the like. In an embodiment, the processor 610 has a cache memory 616 to cache at least one of instructions and data for the multiple reference-layers package substrate in the system 600. The cache memory 616 may be organized into a hierarchal structure including one or more levels of cache memory.

In an embodiment, the processor 610 includes a memory controller 614, which is operable to perform functions that enable the processor 610 to access and communicate with memory 630 that includes at least one of a volatile memory 632 and a non-volatile memory 634. In an embodiment, the processor 610 is coupled with memory 630 and chipset 620. In an embodiment, the chipset 620 is part of a multiple reference-layers package substrate embodiment depicted in FIG. 2. The processor 610 may also be coupled to a wireless antenna 678 to communicate with any device configured to at least one of transmit and receive wireless signals. In an embodiment, the wireless antenna interface 678 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 634 includes, but is not limited to, flash memory, phase change memory (PCM), read-only memory (ROM), electrically erasable programmable read-only memory (EEPROM), or any other type of non-volatile memory device.

The memory 630 stores information and instructions to be executed by the processor 610. In an embodiment, the memory 630 may also store temporary variables or other intermediate information while the processor 610 is executing instructions. In the illustrated embodiment, the chipset 620 connects with processor 610 via Point-to-Point (PtP or P-P) interfaces 617 and 622. Either of these PtP embodiments may be achieved using a multiple reference-layers package substrate embodiment as set forth in this disclosure. The chipset 620 enables the processor 610 to connect to other elements in a multiple reference-layers package substrate embodiment in a system 600. In an embodiment, interfaces 617 and 622 operate in accordance with a PtP communication protocol such as the Intel® QuickPath Interconnect (QPI) or the like. In other embodiments, a different interconnect may be used.

In an embodiment, the chipset 620 is operable to communicate with the processor 610, 605N, the display device 640, and other devices 672, 676, 674, 660, 662, 664, 666, 677, etc. The chipset 620 may also be coupled to a wireless antenna 678 to communicate with any device configured to at least do one of transmit and receive wireless signals.

The chipset 620 connects to the display device 640 via the interface 626. The display 640 may be, for example, a liquid crystal display (LCD), a plasma display, cathode ray tube (CRT) display, or any other form of visual display device. In an embodiment, the processor 610 and the chipset 620 are merged into a multiple reference-layers package substrate embodiment in a system. Additionally, the chipset 620 connects to one or more buses 650 and 655 that interconnect various elements 674, 660, 662, 664, and 666. Buses 650 and 655 may be interconnected together via a bus bridge 672 such as the multiple reference-layers package substrate embodiment. In an embodiment, the chipset 620, via interface 624, couples with a non-volatile memory 660, a mass storage device(s) 662, a keyboard/mouse 664, a network interface 666, smart TV 676, and the consumer electronics 677, etc.

In an embodiment, the mass storage device 662 includes, but is not limited to, a solid state drive, a hard disk drive, a universal serial bus flash memory drive, or any other form of computer data storage medium. In one embodiment, the network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the multiple reference-layers package substrate embodiments in a computing system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into the processor core 612.

To illustrate the multiple reference-layers package substrate embodiments and methods disclosed herein, a non-limiting list of examples is provided herein:

Example 1 is an apparatus, comprising: a semiconductor package substrate including a die side and a land side; a first reference layer in the semiconductor package substrate, including a reference contact corridor, a power contact corridor, and a signal contact corridor; a subsequent reference layer including a subsequent reference contact corridor, a subsequent power contact corridor and a subsequent signal contact corridor; a reference contact that contacts the first reference layer in the reference contact corridor and that contacts the subsequent reference layer; a power contact that is insulated and carried in the power contact corridor and that is carried and insulated through the subsequent reference layer; a signal contact that is insulated and carried in the signal contact corridor and that is carried and insulated through the subsequent reference layer; and wherein the first reference layer and the subsequent reference layer are embedded in the semiconductor package substrate, between the die side and the land side.

In Example 2, the subject matter of Example 1 optionally includes wherein the first reference layer is a package core with a first contact-corridor pitch, and wherein the subsequent reference layer includes a subsequent contact-corridor that includes a subsequent contact-corridor pitch that is different from the first contact-corridor pitch.

In Example 3, the subject matter of any one or more of Examples 1-2 optionally include: wherein the first reference layer is a package core with a first contact-corridor pitch, and wherein the package core is centrally located within the semiconductor package substrate; and wherein the subsequent reference layer includes a subsequent contact-corridor pitch that is different from the first contact-corridor pitch.

In Example 4, the subject matter of any one or more of Examples 1-3 optionally include: wherein the first reference layer is a package core with a first contact-corridor pitch, wherein the package core has a greater vertical thickness than the subsequent reference layer, and wherein the package core is centrally located within the semiconductor package substrate; and wherein the subsequent reference layer includes a subsequent contact-corridor pitch that is different from the first contact-corridor pitch, and wherein the subsequent reference layer is closer to the die side than to the land side.

In Example 5, the subject matter of any one or more of Examples 1-4 optionally include: wherein the first reference layer is a package core with a first contact-corridor pitch, wherein the package core has a greater vertical thickness than the subsequent reference layer, and wherein the package core is centrally located within the semiconductor package substrate; wherein the subsequent reference layer includes a subsequent contact-corridor pitch that is different from the first contact-corridor pitch, and wherein the subsequent reference layer is closer to the die side than to the land side; and a third reference layer in the semiconductor package substrate, wherein the third reference layer is between the first reference layer and the land side.

In Example 6, the subject matter of any one or more of Examples 1-5 optionally include wherein the subsequent reference layer is closer to the die side than to the land side, and wherein the first reference layer is closer to the land side than to the die side, and wherein the first reference layer has a greater vertical thickness than the subsequent reference layer.

In Example 7, the subject matter of any one or more of Examples 1-6 optionally include a third reference layer including a third reference contact corridor, a third power contact corridor and a third signal contact corridor; and wherein the subsequent reference layer is closer to the die side than to the land side, wherein the first reference layer is closer to the land side than to the die side, wherein the third reference layer is between the land side the and the first reference layer, and wherein the first reference layer has a greater vertical thickness than the subsequent reference layer.

In Example 8, the subject matter of any one or more of Examples 1-7 optionally include a third reference layer including a third reference contact corridor, a third power contact corridor and a third signal contact corridor, wherein the third reference layer is coupled to the first reference layer; wherein the subsequent reference layer is closer to the die side than to the land side, wherein the first reference layer is closer to the land side than to the die side, wherein the third reference layer is between the land side the and the first reference layer, and wherein the first reference layer has a greater vertical thickness than the subsequent reference layer.

In Example 9, the subject matter of any one or more of Examples 1-8 optionally include wherein the subsequent reference layer is one of four reference layers embedded in the package substrate between the die side and the land side.

Example 10 is a semiconductor device package, comprising: a semiconductor package substrate including a die side and a land side; a semiconductive device on the die side; a first reference layer in the semiconductor package substrate, including a reference contact corridor, a power contact corridor, and a signal contact corridor; a subsequent reference layer including a subsequent reference contact corridor, a subsequent power contact corridor and a subsequent signal contact corridor; a reference contact that contacts the first reference layer in the reference contact corridor and that contacts the subsequent reference layer; a power contact that is insulated and carried in the power contact corridor and that is carried and insulated through the subsequent reference layer; a signal contact that is insulated and carried in the signal contact corridor and that is carried and insulated through the subsequent reference layer; and wherein the first reference layer and the subsequent reference layer are embedded in the semiconductor package substrate, between the die side and the land side, and wherein the semiconductive device is coupled to the reference contact, the power contact and to the signal contact.

In Example 11, the subject matter of Example 10 optionally includes a printed wiring board contacting a land side electrical array at the land side.

In Example 12, the subject matter of any one or more of Examples 10-11 optionally include a printed wiring board contacting a land side electrical array at the land side; and an external shell on the printed wiring board that provides at least one of physical and dielectric protection for the semiconductor package substrate.

In Example 13, the subject matter of any one or more of Examples 10-12 optionally include wherein the first reference layer is a package core with a first contact-corridor pitch, and wherein the subsequent reference layer includes a subsequent contact-corridor that includes a subsequent contact-corridor pitch that is different from the first contact-corridor pitch.

In Example 14, the subject matter of any one or more of Examples 10-13 optionally include: wherein the first reference layer is a package core with a first contact-corridor pitch, and wherein the package core is centrally located within the semiconductor package substrate; and wherein the subsequent reference layer includes a subsequent contact-corridor pitch that is different from the first contact-corridor pitch.

In Example 15, the subject matter of any one or more of Examples 10-14 optionally include: wherein the first reference layer is a package core with a first contact-corridor pitch, wherein the package core has a greater vertical thickness than the subsequent reference layer, and wherein the package core is centrally located within the semiconductor package substrate; and wherein the subsequent reference layer includes a subsequent contact-corridor pitch that is different from the first contact-corridor pitch, and wherein the subsequent reference layer is closer to the die side than to the land side.

In Example 16, the subject matter of any one or more of Examples 10-15 optionally include a subsequent semiconductive device coupled to the semiconductive device, by a through-silicon via.

In Example 17, the subject matter of any one or more of Examples 10-16 optionally include wherein the semiconductive device is part of a chipset.

In Example 18, the subject matter of any one or more of Examples 10-17 optionally include wherein the semiconductive device is a core processor, further including a subsequent semiconductive device coupled to the semiconductive device, by a through-silicon via, and wherein the subsequent semiconductive device is a memory device.

In Example 19, the subject matter of any one or more of Examples 10-18 optionally include wherein the semiconductive device is a platform controller hub or a chipset, further including a subsequent semiconductive device coupled to the semiconductive device, by a through-silicon via, and wherein the subsequent semiconductive device is a core processor.

Example 20 is a process of assembling a semiconductor package substrate, comprising: forming a core reference layer in a package substrate; forming a subsequent reference layer above a core reference layer in the package substrate; forming a plated through hole that contacts the core reference layer and the subsequent reference layer; and forming an insulated plated through hole through the core reference layer and the subsequent reference layer.

In Example 21, the subject matter of Example 20 optionally includes forming a third reference layer, wherein the subsequent and third reference layers are symmetrically located with the core reference layer between the subsequent reference layer and the third reference layer.

In Example 22, the subject matter of any one or more of Examples 20-21 optionally include wherein the package substrate includes a die side and a land side further including: forming a third reference layer, wherein the subsequent and third reference layers are symmetrically located with the core reference layer between the subsequent reference layer and the third reference layer; and assembling a semiconductive device to the die side.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the disclosed embodiments should be determined with reference to the appended claims, along with the full scope of equivalents to which such claims are entitled.

The invention claimed is:

1. An apparatus, comprising:
a semiconductor package substrate including a die side and a land side;
a first reference layer in the semiconductor package substrate, including a reference contact corridor, a power contact corridor, and a signal contact corridor, wherein the first reference layer includes a core conductor layer;
a subsequent reference layer including a subsequent reference contact corridor, a subsequent power contact corridor and a subsequent signal contact corridor;
a reference contact that contacts the first reference layer in the reference contact corridor and that contacts the subsequent reference layer;
a power contact that is insulated and carried in the power contact, corridor and that is carried and insulated through the subsequent reference layer;
a signal contact that is insulated and carried in the signal contact corridor and that is carried and insulated through the subsequent reference layer; and
wherein the first reference layer and the subsequent reference layer are embedded in the semiconductor package substrate, between the die side and the land side.

2. The apparatus of claim 1, wherein the first reference layer is a package core with a first contact-corridor pitch, and wherein the subsequent reference layer includes a subsequent contact-corridor that includes a subsequent contact-corridor pitch that is different from the first contact-corridor pitch.

3. The apparatus of claim 1:
wherein the first reference layer is a package core with a first contact-corridor pitch, and wherein the package core is centrally located within the semiconductor package substrate; and
wherein the subsequent reference layer includes a subsequent contact-corridor pitch that is different, from the first contact-corridor pitch.

4. The apparatus of claim 1:
wherein the first reference layer is a package core with a first contact-corridor pitch, wherein the package core has a greater vertical thickness than the subsequent reference laver, and wherein the package core is centrally located within the semiconductor package substrate; and
wherein the subsequent reference layer includes a subsequent contact-corridor pitch that is different, from the first contact-corridor pitch, and wherein the subsequent reference layer is closer to the die side than to the land side.

5. The apparatus of claim 1:
wherein the first reference layer is a package core with a first contact-corridor pitch, wherein the package core has a greater vertical thickness than the subsequent reference layer, and wherein the package core is centrally located within the semiconductor package substrate;
wherein the subsequent reference layer includes a subsequent contact-corridor pitch that is different from the first contact-corridor pitch, and wherein the subsequent reference layer is closer to the die side than to the land side; and
a third reference layer in the semiconductor package substrate, wherein the third reference layer is between the first reference layer and the land side.

6. The apparatus of claim 1, wherein the subsequent reference layer is closer to the die side than to the land side, and wherein the first reference layer is closer to the land side than to the die side, and wherein the first reference layer has a greater vertical thickness than the subsequent reference layer.

7. The apparatus of claim 1, further including:
a third reference layer including a third reference contact corridor, a third power contact corridor and a third signal contact corridor; and
wherein the subsequent reference layer is closer to the die side than to the land side, wherein the first reference layer is closer to the land side than to the die side, wherein the third reference layer is between the land side the and the first reference layer, and wherein the first reference layer has a greater vertical thickness than the subsequent reference layer.

8. The apparatus of claim 1, further including:
a third reference layer including a third reference contact corridor, a third power contact corridor and a third signal contact corridor, wherein the third reference layer is coupled to the first reference layer;
wherein the subsequent reference layer is closer to the die side than to the land side, wherein the first reference layer is closer to the land side than to the die side, wherein the third reference layer is between the land side the and the first reference layer, and wherein the first reference layer has a greater vertical thickness than the subsequent reference layer.

9. The apparatus of claim 1, wherein the subsequent, reference layer is one of four reference layers embedded in the package substrate between the die side and the land side.

10. A semiconductor device package, comprising:
a semiconductor package substrate including a die side and a land side;
a semiconductive device on the die side;
a first reference layer in the semiconductor package substrate, including a reference contact corridor, a power contact corridor, and a signal contact corridor, wherein the first reference layer includes a core conductor layer;
a subsequent reference layer including a subsequent, reference contact corridor, a subsequent power contact corridor and a subsequent signal contact corridor;
a reference contact, that, contacts the first reference layer in the reference contact corridor and that contacts the subsequent reference layer;
a power contact that is insulated and carried in the power contact corridor and that is carried and insulated through the subsequent reference layer;
a signal contact that is insulated and carried in the signal contact corridor and that is carried and insulated through the subsequent reference layer; and
wherein the first reference layer and the subsequent reference layer are embedded in the semiconductor package substrate, between the die side and the land side, and wherein the semiconductive device is coupled to the reference contact, the power contact and to the signal contact.

11. The semiconductor device package of claim 10, further including:
a printed wiring board contacting a land side electrical array at the land side.

12. The semiconductor device package of claim 10, further including:
a printed wiring board contacting a land side electrical array at the land side; and
an external shell on the printed wiring board that provides at least one of physical and dielectric protection for the semiconductor package substrate.

13. The semiconductor device package of claim 10, wherein the first reference layer is a package core with a first contact-corridor pitch, and wherein the subsequent reference layer includes a subsequent contact-corridor that includes a subsequent contact-corridor pitch that is different from the first contact-corridor pitch.

14. The semiconductor device package of claim 10:
wherein the first reference layer is a package core with a first contact-corridor pitch, and wherein the package core is centrally located within the semiconductor package substrate; and
wherein the subsequent reference layer includes a subsequent contact-corridor pitch that is different from the first contact-corridor pitch.

15. The semiconductor device package of claim 10:
wherein the first reference layer is a package core with a first contact-corridor pitch, wherein the package core has a greater vertical thickness than the subsequent reference layer, and wherein the package core is centrally located within the semiconductor package substrate; and
wherein the subsequent reference layer includes a subsequent contact-corridor pitch that is different from the first contact-corridor pitch, and wherein the subsequent reference layer is closer to the die side than to the land side.

16. The semiconductor device package of claim 10, further including a subsequent semiconductive device coupled to the semiconductive device, by a through-silicon via.

17. The semiconductor device package of claim 10, wherein the semiconductive device is part of a chipset.

18. The semiconductor device package of claim 10, wherein the semiconductive device is a core processor, further including a subsequent semiconductive device coupled to the semiconductive device, by a through-silicon via, and wherein the subsequent semiconductive device is a memory device.

19. The semiconductor device package of claim 10, wherein the semiconductive device is a platform controller hub or a chipset, further including a subsequent semiconductive device coupled to the semiconductive device, by a through-silicon via, and wherein the subsequent semiconductive device is a core processor.

* * * * *